(12) United States Patent
Cernea et al.

(10) Patent No.: US 6,490,200 B2
(45) Date of Patent: *Dec. 3, 2002

(54) NON-VOLATILE MEMORY WITH IMPROVED SENSING AND METHOD THEREFOR

(75) Inventors: Raul-Adrian Cernea, Santa Clara; Rushyah Tang; Douglas Lee, both of San Jose; Chi-Ming Wang; Daniel Guterman, both of Fremont, all of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/924,410

(22) Filed: Aug. 7, 2001

(65) Prior Publication Data

US 2002/0051384 A1 May 2, 2002

Related U.S. Application Data

(63) Continuation of application No. 09/536,930, filed on Mar. 27, 2000, now Pat. No. 6,282,120.

(51) Int. Cl.[7] .............................................. G11C 16/06
(52) U.S. Cl. .............................. 365/185.21; 365/185.2; 365/189.07; 365/189.09; 365/207
(58) Field of Search ......................... 365/185.21, 185.2, 365/189.09, 206, 207, 189.07, 149

(56) References Cited

U.S. PATENT DOCUMENTS

| 5,172,338 A | | 12/1992 | Mehrotra et al. |
|---|---|---|---|
| 5,508,956 A | | 4/1996 | Campardo et al. |
| 5,568,426 A | | 10/1996 | Roohparvar et al. |
| 5,898,617 A | * | 4/1999 | Bushey et al. ........... 365/185.2 |
| 6,044,019 A | | 3/2000 | Cernea et al. |
| 6,282,120 B1 | * | 8/2001 | Cernea et al. ......... 365/185.21 |

FOREIGN PATENT DOCUMENTS

EP         0801398         10/1997

OTHER PUBLICATIONS

PCT International Search Report PCT/US99/24555 of Apr. 17, 2000.

* cited by examiner

*Primary Examiner*—David Lam
(74) *Attorney, Agent, or Firm*—Skjerven Morrill LLP

(57) ABSTRACT

Floating gate memories such as EEPROM and flash EEPROM have the memory state of a memory cell thereof determined by sensing the conduction current of the cell. Inherent noise fluctuations in the conduction current during sensing are canceled out by averaging the sensing over a predetermined period of time. In one embodiment, as an integral part of the averaging process, the averaged conduction current is obtained directly as a digital memory state. Accuracy in sensing is therefore greatly improved by avoiding sensing noise with the current and avoiding having to resolve its memory state in the analog domain by comparison with another noisy reference current. In another embodiment, conventional sensing techniques are improved when sensing is made by comparison with a reference current by means of a symmetric, switched or non-switched capacitor differential amplifier.

19 Claims, 15 Drawing Sheets

NON-VOLATILE MEMORY WITH IMPROVED SENSING AND METHOD THEREFOR

CROSS REFERENCE TO RELATED APPLICATIONS

This patent application is a continuation of U.S. patent application Ser. No. 09/536,930, filed Mar. 27, 2000, now U.S. Pat. No. 6,282,120, issued on Aug. 28, 2001, which is a continuation of U.S. patent application Ser. No. 09/177,809, filed Oct. 23, 1998, now U.S. Pat. No. 6,044,019.

FIELD OF THE INVENTION

This invention relates generally to floating gate semiconductor memories such as electrically erasable programmable read-only memories (EEPROM) and flash EEPROM, and specifically to circuits and techniques for reading or sensing their memory states.

BACKGROUND OF THE INVENTION

EEPROM and electrically programmable read-only memory (EPROM) are typically used in digital circuits for non-volatile storage of data or program. They can be erased and have new data written or "programmed" into their memory cells.

An EPROM utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate.

The floating gate can hold a range of charge and therefore an EPROM memory cell can be programmed to any threshold voltage level within a threshold voltage window. The size of the threshold voltage window, delimited by the minimum and maximum threshold levels of the device, depends on the device's characteristics, operating conditions and history. Each distinct, resolvable threshold voltage level within the window may, in principle, be used to designate a definite memory state of the cell.

In practice, the memory state of a cell is usually read by sensing the conduction current across the source and drain electrodes of the cell when a reference voltage is applied to the control gate. Thus, for each given charge on the floating gate of a cell, a corresponding threshold voltage may be detected, or equivalently, a corresponding conduction current with respect to a reference control gate voltage may be detected. Similarly, the range of charge programmable onto the floating gate defines a corresponding threshold voltage window or a corresponding conduction current window.

For EPROM memory, the transistor serving as a memory cell is typically programmed to one of two states by accelerating electrons from the substrate channel region, through a thin gate dielectric and onto the floating gate. The memory states are erasable by removing the charge on the floating gate by ultraviolet radiation.

An electrically erasable and programmable read-only memory (EEPROM) has a similar structure but additionally provides a mechanism for removing charge from its floating gate upon application of proper voltages.

An array of such EEPROM cells is referred to as a "Flash" EEPROM array when an entire array of cells, or significant group of cells of the array, is erased together (i.e., in a flash). Once erased, the group of cells can then be reprogrammed.

FIG. 1 illustrates schematically a typical array of non-volatile memory cells 10, such as EPROM, EEPROM or flash EEPROM, accessible by a series of bit lines 20, 22, 24, . . . , and word lines 30, 32, . . . Each memory cell 40 has a source 43, a drain 44, a control gate 46 and a floating gate 48.

A specific cell in a two-dimensional array of EPROM or EEPROM cells is addressed for reading typically by application of a source-drain voltage to a pair of source and drain lines in a column containing the cell being addressed, and application of a control gate voltage to a word line connected to the control gates in a row containing the cell being addressed.

FIG. 2 shows schematically an addressable array of non-volatile memory cells 10 with row and column decoding circuits 50, 52 and a read circuit 60.

Referring also to FIG. 1, when the cell 40 is addressed for programming or reading, appropriate programming or reading voltages ($V_{CG}$, $V_S$, $V_D$) must be supplied respectively to the cell's control gate 46, source 43 and drain 44. An address is applied to the row decoder 50 for connecting $V_{CG}$ to the word line 30 which in turn is connected to the control gate of the cell 40. The same address is also applied to the column decoder 52 for connecting $V_S$ to the source line 20 and $V_D$ to the drain line 22, which are respectively connected to the source and drain of the cell 40.

The memory state of the addressed memory cell 40 is read with the read circuit 60 placing the appropriate operating voltages across the cell's source and drain, and then detecting the level of conduction current flowing between the source and drain.

In the usual two-state EEPROM cell, at least one current breakpoint level is established so as to partition the conduction window into two regions. When a cell is read, its source/drain current is resolved into a memory state by comparing with the breakpoint level (or reference current $I_{ref}$). If the current read is higher than that of the breakpoint level or $I_{ref}$, the cell is determined to be in one logical state (e.g., a "zero" state), while if the current is less than that of the breakpoint level, the cell is determined to be in the other logical state (e.g., a "one" state). Thus, such a two-state cell stores one bit of digital information. A reference current source which may be externally programmable is often provided as part of a memory system to generate the breakpoint level current.

When a cell is programmed to a given state, it is subject to successive programming voltage pulses, each time adding incremental charge to the floating gate. In between pulses, the cell is read back or verified to determine its source drain current relative to the breakpoint level. Programming stops when the current state has been verified to be in a desired region of the partitioned conduction window.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

FIG. 3A illustrates a chunk of memory cells 1 to k being read by a bank of sense amplifiers SA1, . . . , SAk, according to the prior art. Each sense amplifier senses the source-drain current of the cell it is connected to. To increase read performance, a plurality of cells is typically read in parallel chunk-by-chunk. Thus, cell 1, 2, . . . , k is respectively read by sense amplifier 1, 2, . . . k, and the outputs $\Phi_1, \Phi_2, \ldots, \Phi_k$ are latched in a chunk shift register. When all bits of the chunk are stored in the chunk shift register, the chunk can be shifted out serially. In the example, the conduction window of each cell is partitioned by three breakpoints. Each sense amplifier senses the source-drain current of a cell in the chunk and resolves the current into a memory state by comparing it relative to three reference currents, $I_{ref1}$, $I_{ref2}$ and $I_{ref3}$. Therefore, the three breakpoints can in principle partition the conduction window into four regions representing four possible memory states of the cell.

However, in practice, owing to the noises found in both the sensed current of a cell and the reference currents it is compared to, if the two currents are close together within their error margins, the memory state of the cell cannot be determined definitely. To offset this, a cell is usually programmed well into a partitioned region. In this way, even if the verification or read has an error due to noise, a margin of safety has been programmed to enable the programmed state of the cell to be read correctly. This is accomplished by setting up a margin or a guard band around each breakpoint or reference current. During program verification, the sensed cell current must clear such a margin in order to guarantee that it is programmed well within a desired conduction region of the partitioned window.

FIG. 3B(a) illustrates a reference clock in which a reading may be taken at each clock cycle. FIG. 3B(b) shows an initial setup period for read where the currents are irregular and not ready for read. After this setup period, the currents settle down to a stable and quiescent state and are ready for read (i.e., comparison of the cell's current against a reference current). FIG. 3B(c) illustrates that if a reading is taken every clock cycle, the sensed cell current typically has a noise fluctuation which may be denoted by $\Delta I$.

FIG. 3C illustrates the use of breakpoint levels to partition the non-volatile memory's conduction window into separate regions in order to allow multi-state storage, and the implementation of a guard band around each breakpoint level to allow for noise fluctuations. In the example, the conduction window is from about 1 $\mu A$ to about 50 $\mu A$. Three breakpoints, $I_{ref1}$, $I_{ref2}$ and $I_{ref3}$ (e.g., 6, 20 and 40 $\mu A$) partition the source-drain range or window into four regions representing memory states "3", "2", "1", "0" respectively. The reading is done with the control gate voltage set at 5V. The four solid I(t) versus $V_{CG}$ lines represent four possible charge levels that can be programmed on a floating gate of a memory cell, respectively corresponding to four possible memory states. In order to allow for the possible noise fluctuation $\Delta I$, a margin of $\Delta I$ on either side of the breakpoint is set up when the cell is being programmed. Thus, a cell must be programmed with a charge that gives rise to a sensed current clearing the margins. In this way, when the cell is subsequently read, it will be read correctly even if there is an error of $\Delta I$ associated with noise fluctuations.

As an example, the margin can be $\pm 5$ $\mu A$ around each breakpoint, forming a guard band 10 $\mu A$ wide. With three guard bands, they could take up 60 percent of the current window. Thus, it can be seen that the use of margins or guard bands will substantially consume valuable space in the conduction window of a memory cell and therefore significantly reduce the number of possible partitions. As a result, floating-gate memory devices in the past have been mostly two-state, and it has been difficult to increase the storage capacity of these devices significantly above two-state.

SUMMARY AND OBJECTS OF THE INVENTION

Accordingly, it is a primary object of the present invention to improve the storing capacity of floating-gate memories where each cell can support memory states substantially greater than two.

It is a further object of the present invention to provide improved read and program circuits as part of an EPROM, EEPROM or flash EEPROM integrated circuit memory chip.

It is also an object of the invention to provide read and program circuits which are simpler, easier to manufacture and have improved accuracy and reliability over an extended period of use.

It is yet another object of the present invention to provide Flash EEPROM semiconductor chips that can replace magnetic disk storage devices in computer systems.

These and additional objects are accomplished by improvements in EEPROM array read and write circuits and techniques where the range of charge programmable into the floating gate of a memory cell gives rise to a corresponding range of conduction states detectable by corresponding cell conduction currents across the source and drain of the cell, and where each resolvable conduction state is usable to represent a logical memory state, the improvement being a sense amplifier and method where the sensing accuracy of the cell current level is substantial improved by averaging the cell current over a predetermined period of time sufficient for noise fluctuations therein to cancel to a predetermined value, and in the process also resolves in the digital domain the noise-canceled current level directly into a memory state.

The improved sensing accuracy allows the range of conduction states (conduction window) of the cell to be finely partitioned to support higher density storage. In this way, it is possible to have two or substantially more distinct states within each memory cell over an extended lifetime of the memory cells, so that one or substantial more bits may be reliably stored in each cell.

A conventional sense amplifier is substantially less accurate because it senses a noisy cell current. The error is further compounded by having to resolve its memory state in the analog domain by comparing against yet another noisy reference current that is used to demarcate the states of the conduction windows. The input noise rejection of instantaneous sensing is low. There is also noise from output switching as well as poor rejection of power line noise. Margins have to be set up in the partitioning of the conduction window to offset the sensing and resolving errors. This prevents finer partitioning of the conduction window, resulting in lower density cell storage.

According to one embodiment of the present invention, the averaging of the cell current is accomplished by a current-to-frequency converter that outputs a wave train with a frequency proportional to the cell current. The converter operates over a predetermined integration time that is long compared to the noise fluctuation of the cell current and outputs a wave train segment in that time. The number of cycles in the wave train segment is counted by a counter and is proportional to the sensed, time-averaged current. A timer circuit provides the timing for the integration time.

In one embodiment of the counter for a n-bit cell, the counter comprises a series of at least n-cascading Divide-By-Two frequency dividers, that in combination output the count in the wave train segment as a memory state in binary format.

In the preferred embodiment, a group (chunk) of cells is sensed in parallel and the sensed states are shifted out by a shift register chunk-by-chunk. In this way, the longer time required to perform a time-averaged sensing for each cell is offset by the time saving when sensing a chunk of cells in parallel.

Thus, the invention provides much more accurate sensing by avoiding the convention methods of sensing cell currents with their noise fluctuations untreated, and avoiding having to determine the relative location of the sensed current in the conduction window by comparing it against another noisy reference current in the analog domain.

According to another embodiment of the invention, adaptation is made to existing sense amplifier architectures where the memory cell current is compared to a reference current. An integrating comparator is employed where the comparison between the two currents are made over the predetermined period of time sufficient for noise fluctuations therein to cancel to a predetermined value. Preferred embodiments of the integrating comparator include symmetric, switched or non-switched capacitor differential amplifier. The resulting advantage is that little modifications need be made to existing highly optimized circuits. In addition, conventional, and well known integrating amplifier techniques or switched capacitor differential amplifier can be employed. By the same token, these techniques are typically used in combination with other well established techniques such as filtering, analog-digital conversion, including offset cancellation and power supply or other noise rejections.

Additional objects, features and advantages of the present invention will be understood from the following description of its preferred embodiments, which description should be taken in conjunction with the accompanying drawings.

DESCRIPTION OF THE PREFERRED EMBODIMENTS

As described earlier, the inaccuracies of conventional sense amplifiers necessitate the implementation of margins and guard bands within the conduction window of a float-gate memory device. This encroachment increases with the number of partitioning in the window. Thus, it has been difficult to increase the partitioning to enable a cell to store multi-state data.

One important feature of the present invention is to improve the accuracy of the sensing by suitable treatment of noises inherent in the sensing device, thereby significantly reducing the width of the margins or guard bands.

Figure 1:
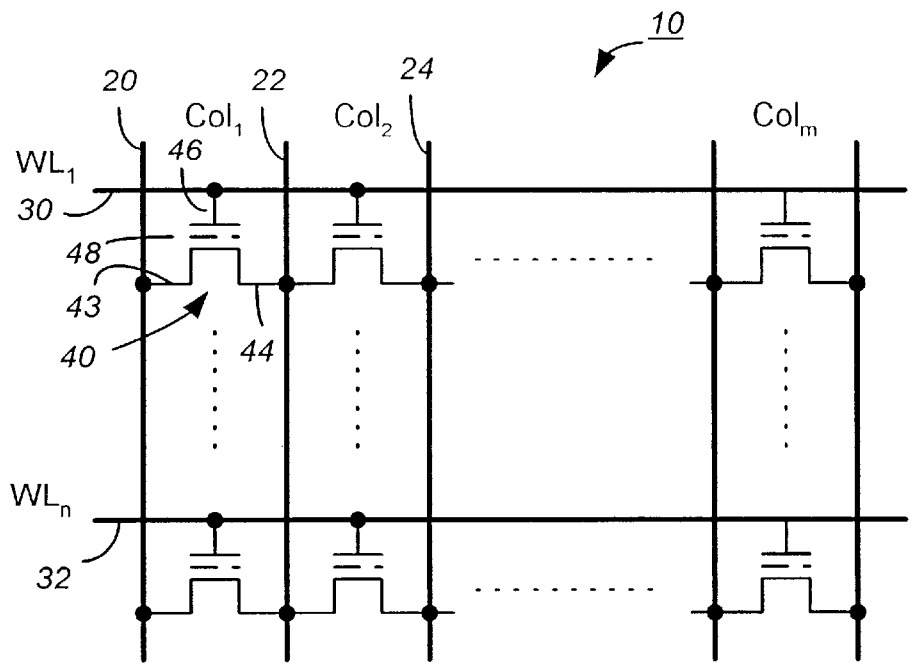
FIG. 1 illustrates schematically a typical array of non-volatile memory cells accessible by a series of bit lines and word lines, and each memory cell having a source, a drain, a control gate and a floating gate.
Figure 2:
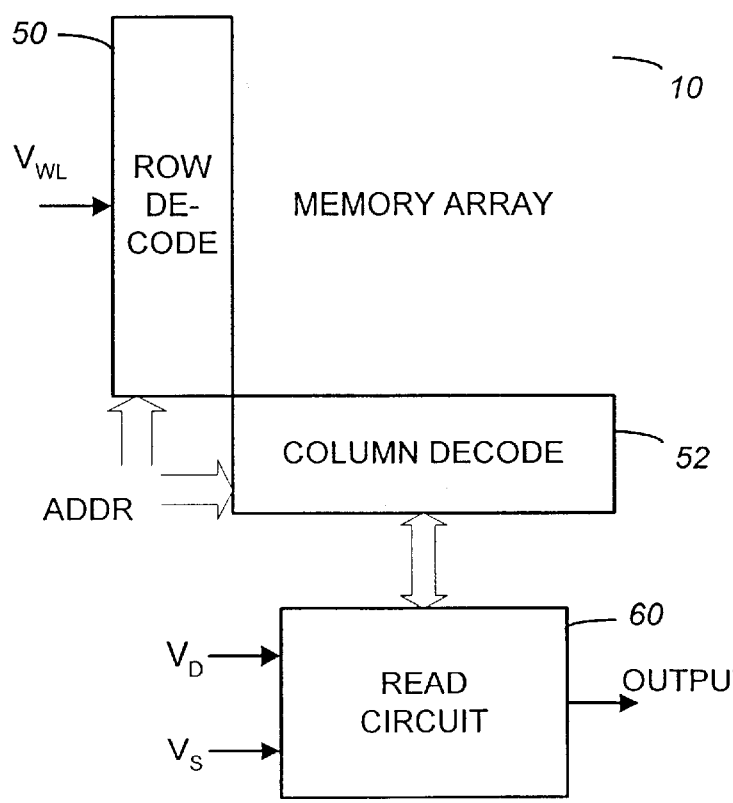
FIG. 2 shows an addressable array of non-volatile memory cells with row and column decoding circuits and a read circuit.
Figure 3A:
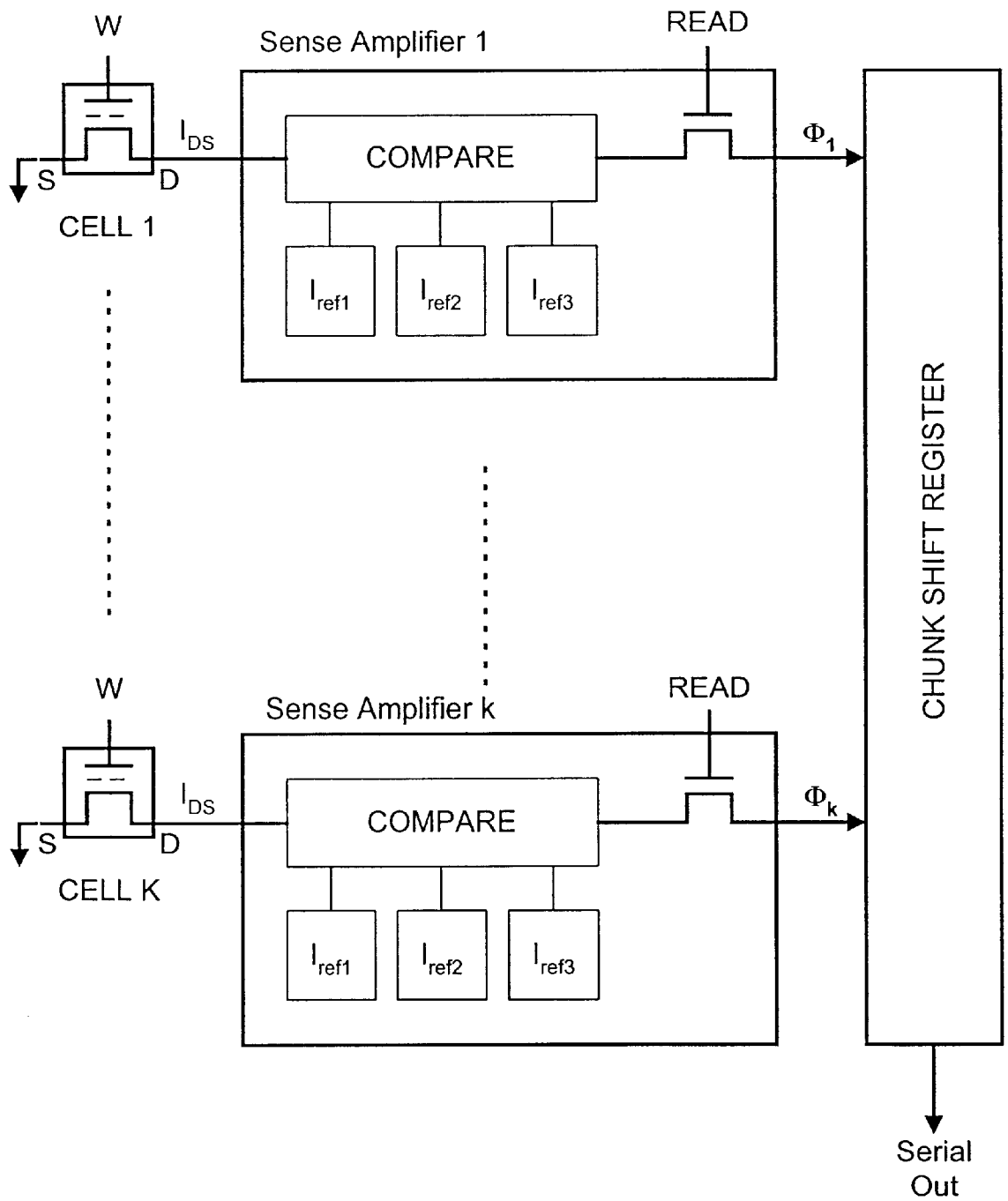
FIG. 3A illustrates a chunk of memory cells 1 to K being read by a bank of sense amplifiers, according to the prior art.
Figure 3B:
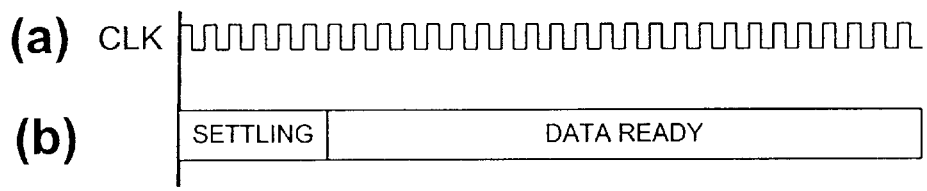
FIGS. 3B(a)–3B(c) respectively illustrate a system clock, the ready status of data for sensing, and the noise fluctuations of the source-drain current of a memory cell being sensed.
Figure 3B:
Figure 4A:
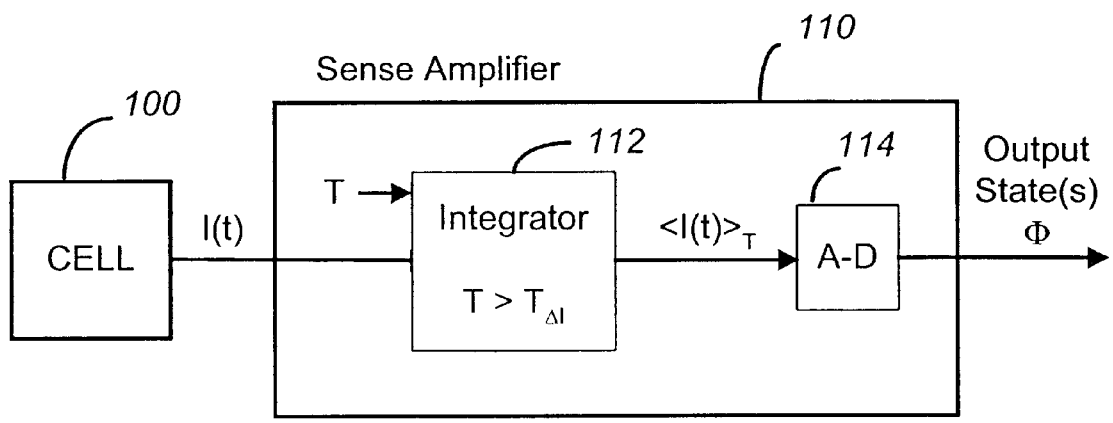
FIG. 4A is a schematic block diagram of the sense amplifier according to a general, preferred embodiment of the present invention.
Figure 4B:
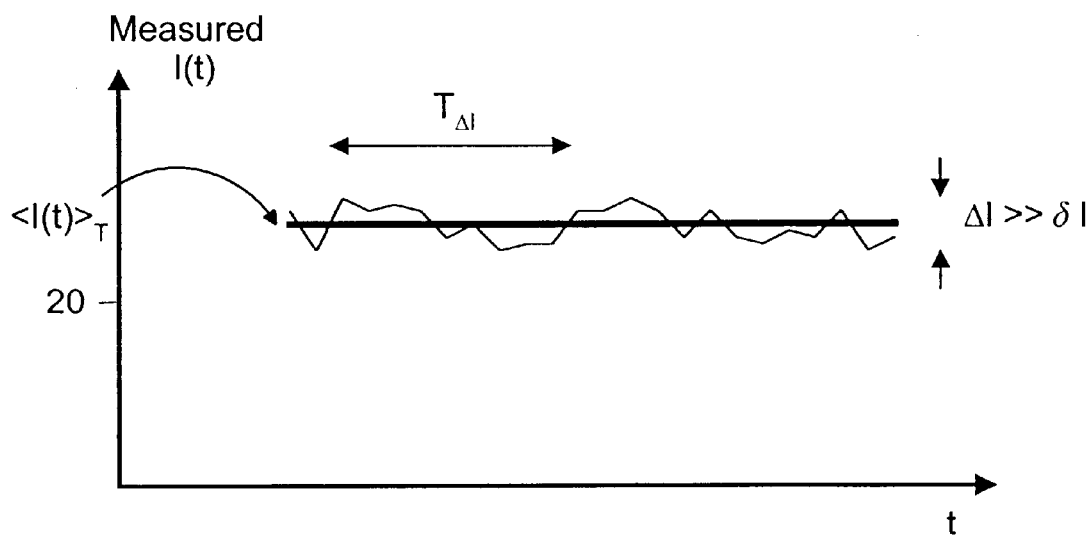
FIG. 4B illustrates a source-drain current I(t) having noise fluctuations with a characteristic period $T_{\Delta I}$, and the resulting time-averaged $<I(t)>_T$ as processed by the sense amplifier of the present invention.

FIG. 4A is a schematic block diagram of the sense amplifier according to a general, preferred embodiment of the present invention. A cell 100 has its source-drain current I(t) sensed by a sense amplifier 110. I(t) typically has a noise component as illustrated in FIG. 3B and FIG. 4B with noise fluctuations given by ΔI. One special feature of sense amplifier 110 is to process this fluctuating current by means of an integrator 112 which effectively produces a time-averaged current $<I(t)>_T$ over a predetermined period T. An A/D module 114 further converts the sensed analog, time-averaged current into a digital format corresponding to an output memory state Φ.

FIG. 4B illustrates a source-drain current I(t) having noise fluctuations with a characteristic period $T_{\Delta I}$, and the resulting time-averaged $<I(t)>_T$ as processed by the sense amplifier of the present invention. The sensed source-drain current of a memory cell, I(t) has a time-dependent random noise component $\Delta I$. When I(t) is averaged over a sufficient period of time T, the noise fluctuations are substantially canceled out. The resultant error in $<I(t)>_T$ is given by $\delta I$ which is substantially less than $\Delta I$. The sufficient period of time for averaging would be a period T substantially greater than a characteristic time $T_{\Delta I}$ of the noise fluctuation. This $T_{\Delta I}$ can be defined as a period where a predetermined amount of noise fluctuation has canceled out.

For example, in many EEPROM or flash EEPROM devices, the characteristic fluctuation time $T_{\Delta I}$ has been estimated to be from 10 nanoseconds to several hundred nanoseconds. Thus, for these typical devices, the averaging or integration time T should preferably be substantially higher than $T_{\Delta I}$. In contrast, prior art sensing of I(t) is sensed instantaneously in a time less than $T_{\Delta I}$.

Figure 4C:
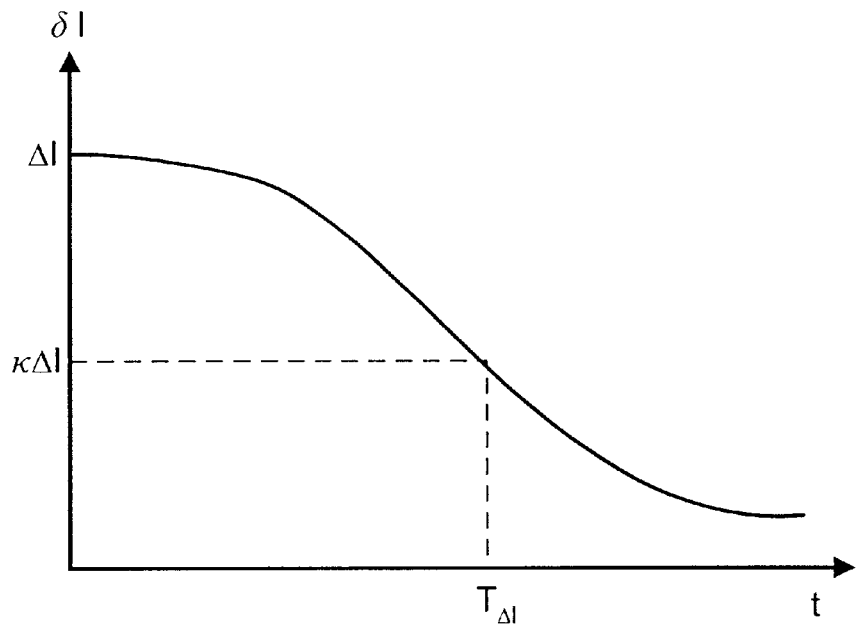
FIG. 4C illustrates how such a characteristic fluctuation time can be defined.

FIG. 4C illustrates how such a characteristic fluctuation time can be defined. The graph is a plot of noise fluctuation of the time-averaged sensed current $<I(t)>_T$ versus the averaging or integration time T. When the integrated time T is zero, as in the conventional case of no time averaging, the noise fluctuation in a sensed current is given by $\Delta I$. As the averaging time is increased, the noise fluctuation in the time-averaged sensed current decreases due to phase cancellations. The characteristic averaging or integration time $T_{\Delta I}$ can be defined as the time to perform the averaging of the sensed current until its mean fluctuating is reduced by a factor $\kappa$, where $\kappa$, for example, may equal $e^{-1}$.

Figure 3C:
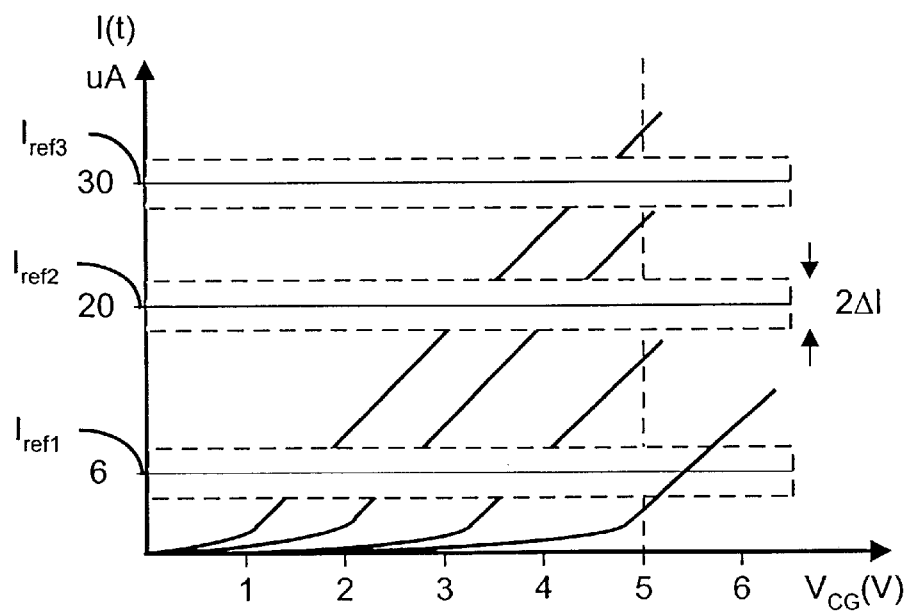
FIG. 3C illustrates the use of breakpoint levels to partition the non-volatile memory's conduction window into separate regions in order to allow multi-state storage, and the implementation of a guard band around each breakpoint level to allow for noise fluctuations.
Figure 4D:
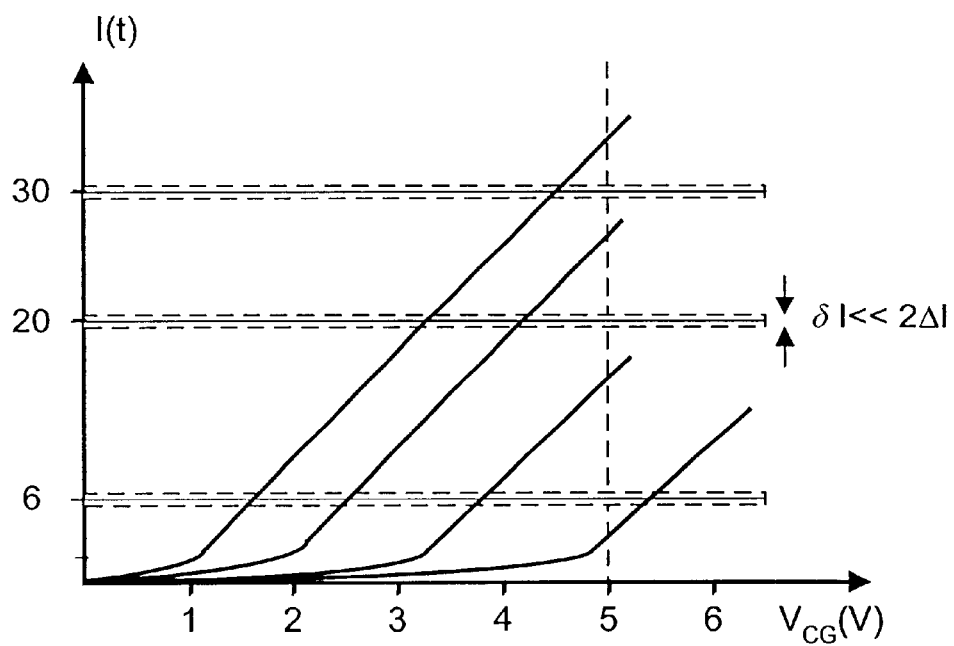
FIG. 4D illustrates one advantage of the present invention in requiring a much reduced guard band as compared to that of FIG. 3C of the prior art.

FIG. 4D illustrates one advantage of the present invention in requiring a much reduced guard band as compared to that of FIG. 3C of the prior art. Since, the time-averaged sensed current has an error $\delta I << \Delta I$, the guard band around each breakpoint in the partitioned conduction window is substantially reduced. This will avoid wasting useful conduction window space, and allow more partitions to be made so as to support even higher density multi-state.

Figure 5:
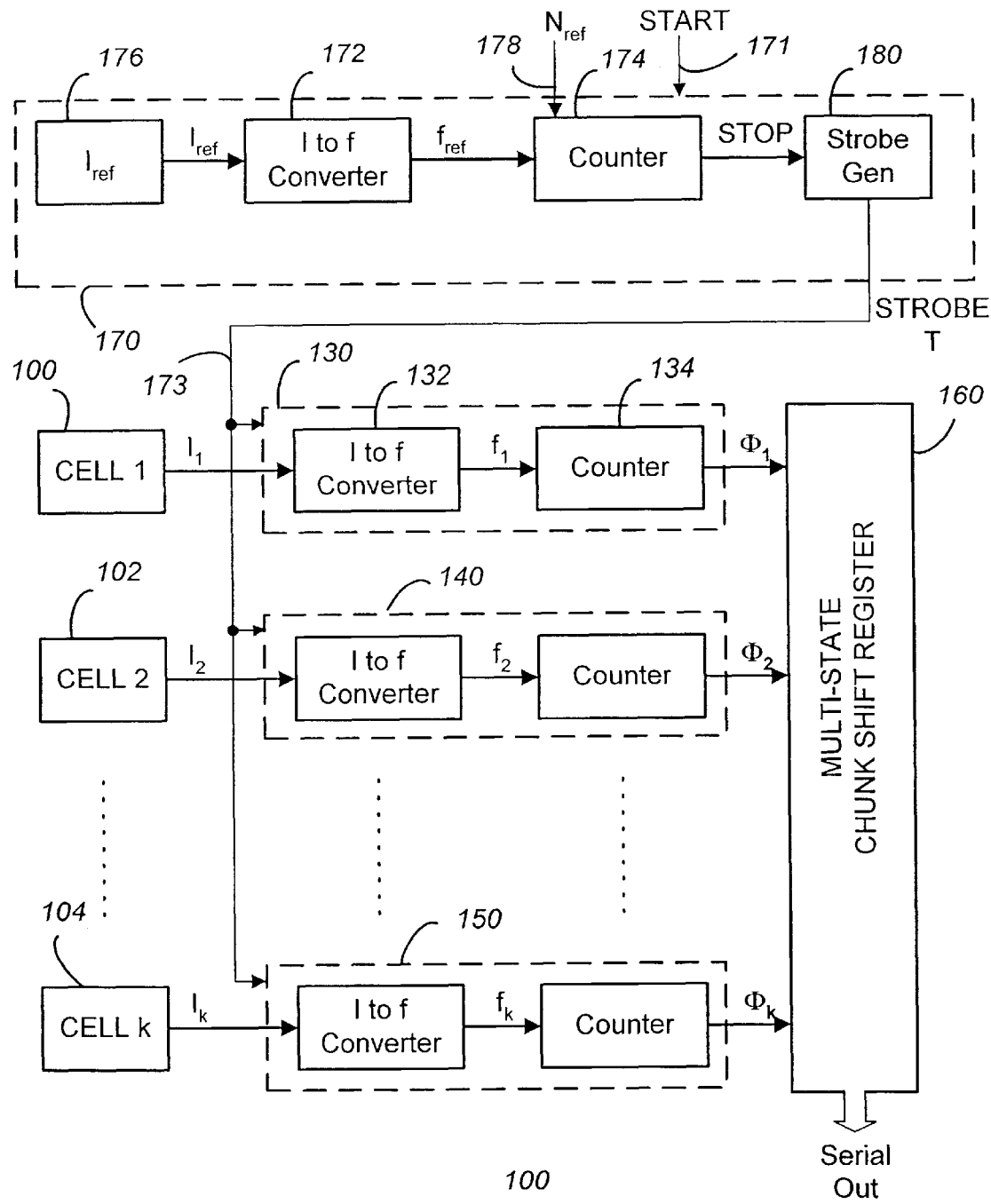
FIG. 5 is a detailed schematic block diagram of the sense amplifier shown in FIG. 4A, according to a preferred embodiment of the present invention.

FIG. 5 is a detailed schematic block diagram of the sense amplifier shown in FIG. 4A, according to a preferred embodiment of the present invention.

Preferably, a chunk of k (e.g., k=128) cells are sensed in parallel by a corresponding bank of k sense amplifiers, such as 130, 140, . . . 150. The bank of sense amplifiers outputs a data chunk of k sensed states $\Phi_1, \Phi_2, \ldots, \Phi_k$ that is loaded into a multi-state chunk shift register 160 which in turn shifts out the data chunk-by-chunk.

Each sense amplifier, such as sense amplifier 130, comprises a current-to-frequency (I-to-f) converter 132 and a counter 134. In the preferred embodiment, the I-to-f converter converts the cell's current $I_1$ into a wave train having a frequency $f_1$ proportional to the current $I_1$. This frequency $f_1$ is then measured by the counter 134 to obtain the logical memory state $\Phi_1$. Both the I-to-f converter 132 and the counter 134 within the sense amplifier 130 perform their operation over an integration time T.

Thus, over the integration time T, a wave train segment is produced by the I-to-f converter 132. Since the frequency of the wave train is proportional to the current $I_1$, so will the number of cycles contained in this segment. By counting the number of cycles in this segment with the counter 134, the magnitude of $I_1$ and therefore the memory state of the cell 100 can be obtained. Since the operations of the I-to-f converter 132 and the counter 134 are performed over the time period T, they are equivalent to the combined operations of time-averaging by the integrator 112 and digital conversion by the A/D unit 114 shown in FIG. 4A.

A timer circuit 170 generates the timing for the integration time T in the form of a strobe signal in a strobe line 173. The strobe signal controls the timing of each of the sense amplifiers such as 130, 140, . . . , 150, associated with the chunk.

Since the number of cycles in a wave train is proportional to the integration time, a normalized integration time is determined by the time taken to count a given number of cycles $N_{ref}$ in a reference wave train with frequency $f_{ref}$ generated from a reference current $I_{ref}$. The timer circuit 170 comprises an I-to-f converter 172 for receiving $I_{ref}$ and generating a reference wave train segment, and a counter 174 to count the number of cycles in the reference segment.

The input current $I_{ref}$ is provided by a current source 176 that supplies a reference current. In a preferred embodiment, $I_{ref}$ is provided by scaling the source-drain current of a memory cell. Similar techniques have been described in U.S. Pat. No. 5,172,338, the entire disclosure thereof is incorporated herein by reference. $I_{ref}$ is preferably chosen to be the highest possible conduction current the cells of a memory device can support so that it can be easily scaled to represent the upper limit of the conduction window.

The counter 174 outputs a STOP signal to a strobe generator 180 after it has counted $N_{ref}$ cycles of the wave train from the I-to-f converter 172.

FIGS. 6(a) to 6(d) are timing diagrams for the strobe generator shown in FIG. 5. In operation, the strobe generator 180 of the timer circuit 170 generates a strobe signal STROBE shown in FIG. 6(d). Essentially, the integration time T commences with STROBE going HIGH and terminates with STROBE going LOW. STROBE goes HIGH with a leading edge in response to a START signal shown in FIG. 6(a), and it goes LOW in response to a STOP signal.

Figure 6:
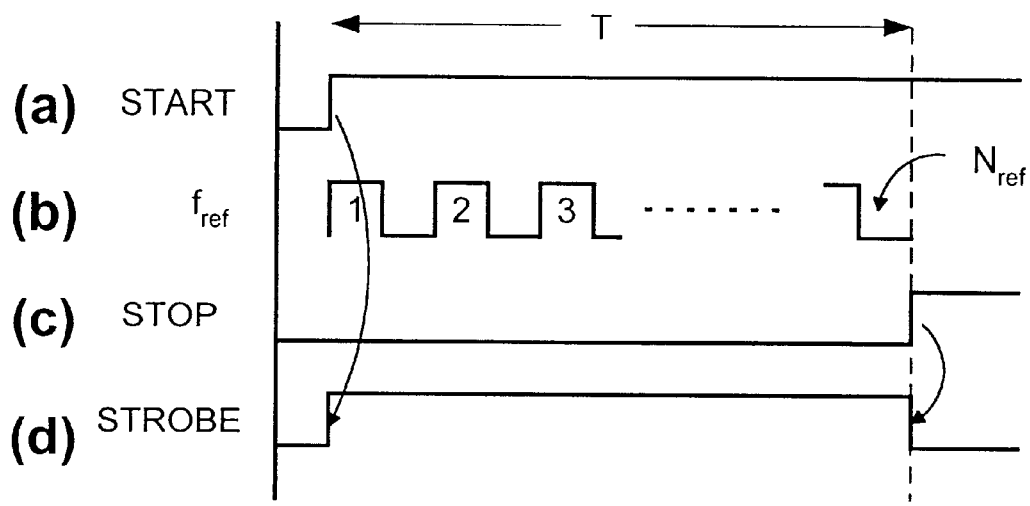
FIGS. 6(a)–6(d) are timing diagrams for the Strobe generator shown in FIG. 5.

A START signal is received by the timer circuit via an input 171. START induces STROBE to go HIGH and also enables the I-to-f converter 172 and the counter 174. Thus, a wave train shown in FIG. 6(b) begins to emerge from the I-to-f converter 172 and its cycles are counted by the counter 174. The STOP timing is controlled by when the number of counts has reached $N_{ref}$. In that event, a STOP signal shown in FIG. 6(c) is supplied to the strobe generator to produce the trailing edge of STROBE, at which time, the integration period T terminates. As mentioned before, the integration period T is preferably much greater than the characteristic fluctuation time $T_{\Delta I}$, and for typical memory devices, T is of the order of 100 nanoseconds or greater.

Figure 7:
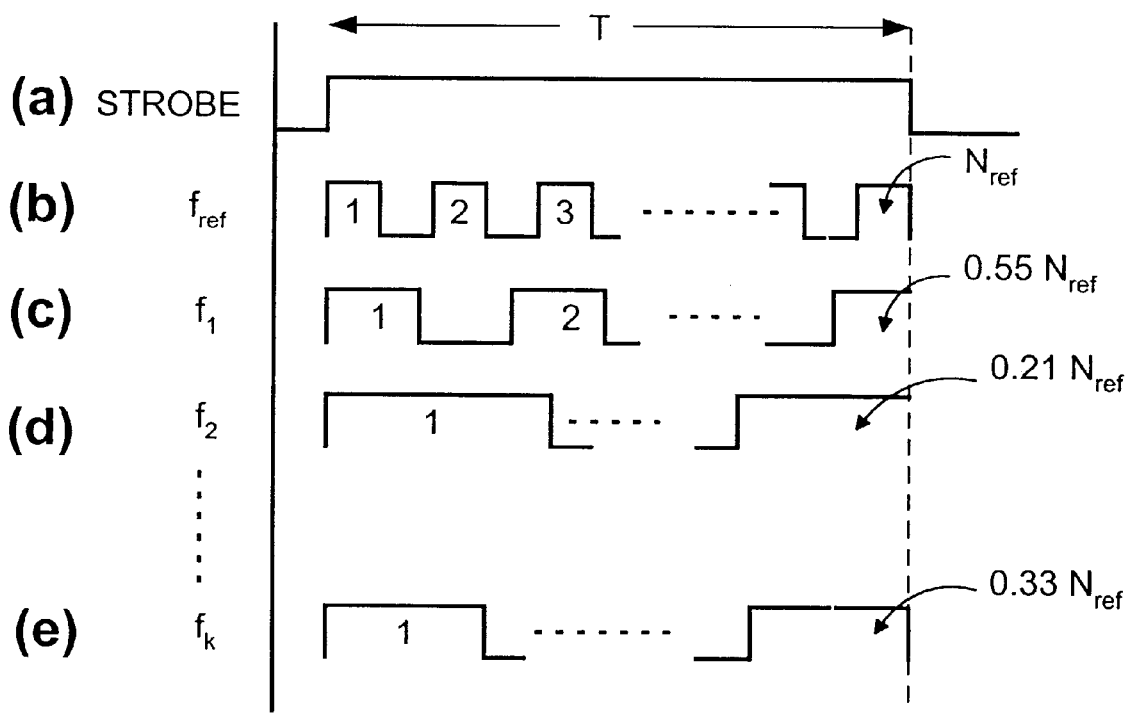
FIGS. 7(a)–7(e) are timing diagrams for the sense amplifiers shown in FIG. 5.

FIGS. 7(a)–7(e) are timing diagrams for the sense amplifiers shown in FIG. 5. As described in connection with FIG. 5, each of the sense amplifiers 130, 140, . . . , 150 respectively senses the source-drain currents $I_1, I_2, \ldots, I_k$ of the chunk of k memory cells, 100, 102, . . . , 104. Each of the sensed currents $I_1, I_2, \ldots, I_k$ are converted by an associated sense amplifier's I-to-f converter into associated wave trains with frequencies $f_1, f_2, \ldots, f_k$ as shown in FIGS. 7(c)–7(e).

For ease of comparison in FIGS. 7(a)–7(e), the timer circuit timings shown in FIGS. 6(d) and 6(b) are shown again as FIGS. 7(a) and 7(b). As, described earlier, the integration time T, when normalized, is given by the time it takes to count $N_{ref}$ cycles in the wave train produced by the conversion of $I_{ref}$, and $I_{ref}$ corresponds to the upper limit of the conduction window. Thus, $N_{ref}$ corresponds to the upper limit of the conduction window and will be the highest count. All other sensed current such as $I_1, I_2, \ldots, I_k$ will produce wave trains with corresponding counts $N_1, N_2, \ldots, N_k$ which are fractions of $N_{ref}$. In this way, the full extent of the conduction window is spanned by $N_{ref}$ while the corresponding states of $N_1, N_2, \ldots, N_k$ are determined by their relative scale as fractions of $N_{ref}$ in the conduction window.

The counter such as 134 and 174 has been described schematically to count the number of cycles in a wave train. It will be understood that counting of fractional cycles is also contemplated.

FIGS. 7(c)–7(e) show examples of possible memory states programmed into three memory cells. They are respectively sensed to be $0.55\ N_{ref}$, $0.2\ N_{ref}$ and $0.33\ N_{ref}$. In one example, the conduction window is partitioned into eight regions with seven breakpoints at $(1/8, 2/8, 3/8, 4/8, 5/8, 6/8, 7/8)N_{ref}$. Such a partitioning will differentiate between ten logical states ("0" to "9") and enable each cell to store three bits of data. In this partitioning scheme, the three cells are respectively in the logical states ("5", "1", "2"). In another example, the conduction window may be partitioned into sixteen regions with fifteen breakpoints at $(1/16, 2/16, 3/16, 4/16, 5/16, 6/16, 7/16, 8/16, 9/16, 10/16, 11/16, 12/16, 13/16, 14/16, 15/16)N_{ref}$. This will allow sixteen logical states and enable each cell to store four bits of data. The three cells are respectively in the logical states ("9", "4", "6").

Thus, it can be seen that when the condition $T \gg T_{AI}$ is already satisfied, $N_{ref}$ is preferably chosen to correspond to the number of partitioning in the conduction window of a cell or multiples thereof. In this way, the count resulted from a sensed cell current $<I(t)>_T$ will correspond to its logical state.

Figure 8:
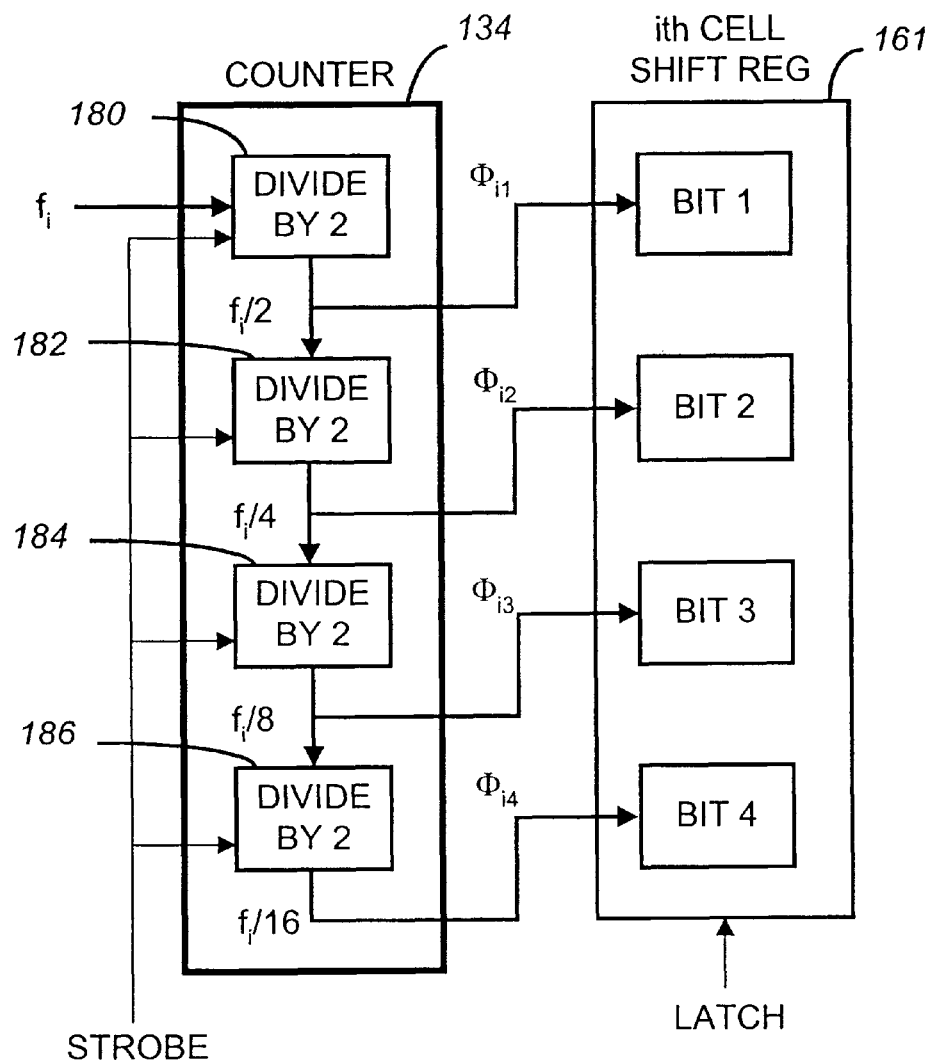
FIG. 8 shows a preferred embodiment of the counter in the sense amplifier shown in FIG. 5.

FIG. 8 shows a preferred embodiment of the counter in the sense amplifier shown in FIG. 5. In the 4-bit cell described above, there are 16 possible logical states ("0" to "15") and the sensed logical states from the three cells are respectively ("9", "4", "6"). When these logical states are expressed in binary form, their states $\Phi$ are respectively ("1001", "0100", "0100"). A counter 134 that will receive the current converted wave train and count and encode the sensed logical state into 4 binary bits $(\Phi_{11}, \Phi_{12}, \Phi_{13}, \Phi_{14})$ is given by cascading four Divide-By-Two frequency dividers 180, 182, 184, 186. The 4 binary bits are latched into a 4-bit register 161 at an opportune time. The 4-bit register 161 represents a multi-bit register associated with the cell 100 component of the shift register 160 shown in FIG. 5. The wave train $f_1$ is received by the first frequency divider 180 which outputs it as a wave train with halved the frequency $f_1/2$. This output is sent down two paths. In the first path, it is sent as the first bit $\Phi_{11}$ to be latched into the first of the 4-bit register 161. In the second path it is input into the second frequency divider 182 which outputs it as a wave train with halved the frequency, resulting in a wave train with frequency $f_1/4$. Again, the output is to be latched as $\Phi_{12}$ in the second of the 4-bit register 161 and also to be sent to the next frequency divider 184. Similar, the outputs from the frequency dividers 184, 186 are to be latched as $\Phi_{13}$ and $\Phi_{14}$ respectively. In general, for an n-bit cell, there will be n-cascaded frequency dividers.

Figure 9A:
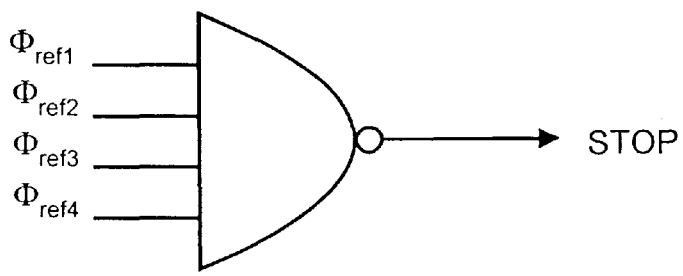
FIG. 9A is a schematic block diagram of the strobe generator shown in FIG. 5, according to a preferred embodiment of the present invention.

FIG. 9A is a schematic block diagram of the strobe generator shown in FIG. 5, according to a preferred embodiment of the present invention. For a 4-bit cell partitioning, a 4-way NAND gate 178 is used to generate the STOP signal in the signal line 181. As shown in FIG. 6(c), the STOP signal is generated when $N_{ref}$ number of cycles has been counted in the wave train converted from the reference current $I_{ref}$. In a 4-bit cell, if $N_{ref}=16$, then a count of all 16 cycles amounts to the last logical state "16" which corresponds to the binary state "1111". Referring to the timer circuit 170 shown in FIG. 5 its counter 174 is similar to that shown in FIG. 8. After the counter 174 has completed counting the reference wave train with frequency $f_{ref}$, its output binary state is given by $(\Phi_{ref1}, \Phi_{ref2}, \Phi_{ref3}, \Phi_{ref4})=(1, 1, 1, 1)$. The STOP signal in the signal line 181 is produced when all four inputs to the NAND gate 178 are "1". In general, for an n-bit cell, $N_{ref}=2^n$ and the last logical state in binary form is given by n "1"'s, and the NAND gate 178 has n inputs.

Figure 9B:
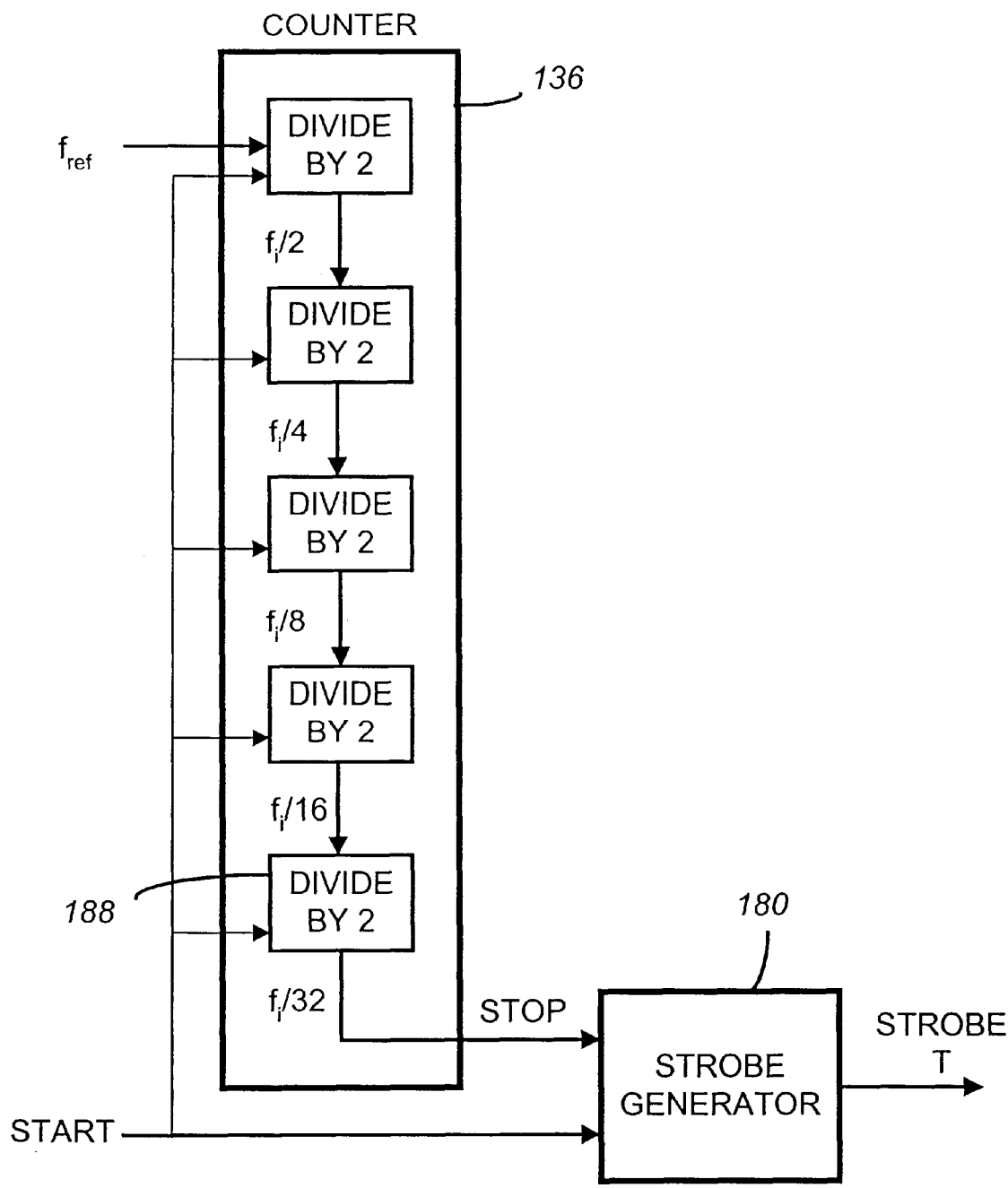
FIGS. 9B illustrates another embodiment of the strobe generator shown in FIG. 5.

FIG. 9B illustrates another embodiment of the strobe generator shown in FIG. 5. For a 4-bit cell, the timer circuit's counter 174 is modified from that shown in FIG. 8 with an additional Divide-By-Two frequency divider 188. The STOP signal is output from the frequency divider 188, where only until the final count will the STOP signal change from a "1" state to a "0" state.

Figure 10A:
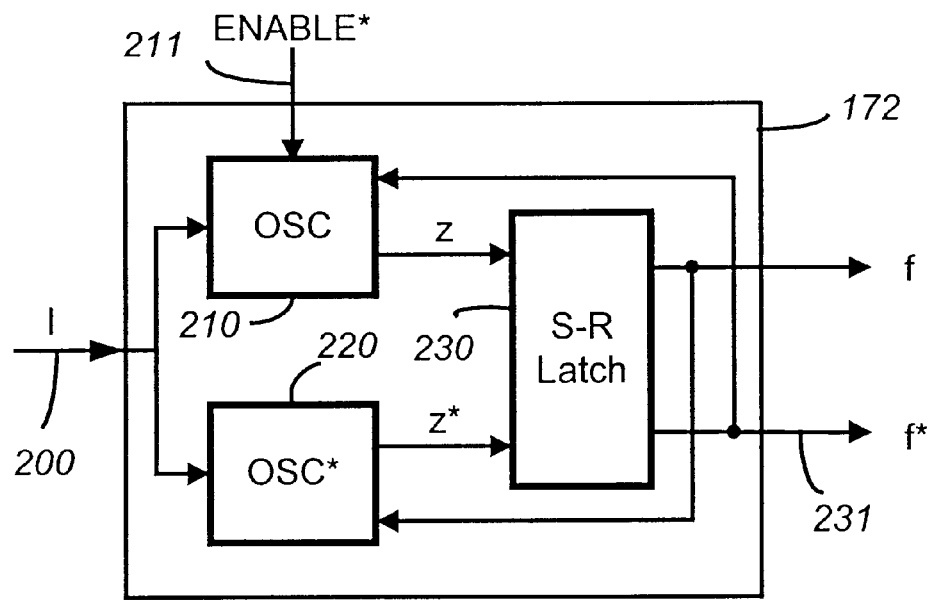
FIG. 10A illustrates a preferred embodiment of the Current-to-Frequency Converter shown in FIG. 5.

FIG. 10A illustrates a preferred embodiment of the Current-to-Frequency Converter shown in FIG. 5. The current I to be converted is input via an input 200 into two complementary oscillators 210, 220 and the resulting complementary outputs z and z* are used as inputs to a Set-Reset (S-R) latch 230 to generate the converted wave train signal f and its complement f*. The wave train signals f and f* are fed back to time the complementary oscillators 220, 210 respectively. An ENABLE* signal in an input line 211 to the oscillator 210 serves to start and stop the oscillator.

Figure 10B:
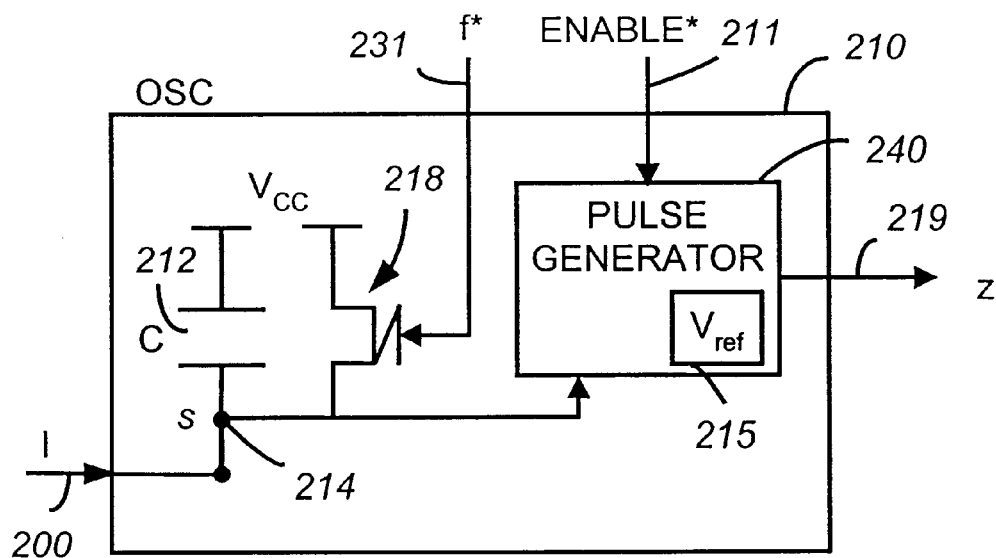
FIG. 10B illustrates in more detail the oscillator shown in FIG. 10A.

FIG. 10B illustrates in more details the oscillator 210 shown in FIG. 10A. Essentially, a capacitor 212 connected on one end to a voltage source $V_{cc}$ and the other end to a node 214 tied to a current source from the input line 200 is constantly being charged and discharged. In this case, the current source is the source-drain current of the cell being sensed. The rate of charge and discharge is proportional to the sensed current. It is also dependent on the capacitance C of the capacitor 212 and a trip point voltage $V_{ref}$. The $V_{ref}$ voltage is provided from a $V_{ref}$ source 215 that when reached by the voltage $V_S$ at the node 214 the capacitor 212 begins to discharge. A p-channel transistor 218 shunting across the capacitor 212 provides a discharged path when it is conducting. The timing of the p-channel transistor 218 is controlled by its gate voltage given by the signal f* from the output of the S-R latch from the line 231. The rate of charge and discharge is manifested by the voltage $V_S$ at the node 214. $V_S$ is fed into a pulse generator 240 to generate a pulse train z when it is enable by an ENABLE* signal in a line 211. The pulse train z is then used to generate the wave train f or f* by means of the S-R latch 230.

The operations of the I-to-f Converter 172 shown in FIG. 10A and the oscillator 210 shown in FIG. 10B are best understood when considered in combination with the timing diagrams shown in FIGS. 11(a)–11(g).

When the ENABLE* signal in line 211 goes LOW, the pulse generator 240 is enabled. As the capacitor 212 begins to charge up, a potential difference develops across the capacitor resulting in the voltage $V_S$ at the node 214 decreasing linearly from $V_{cc}$ (see FIG. 11(b) second column). When $V_S$ reaches the reference voltage $V_{ref}$ the pulse generator outputs a signal z in the form of a pulse (FIG. 11(d), between second and third column) that is used to set the S-R latch 230. This is used to set the S-R latch 230 to generate the next rising edge for the wave train f (see FIG. 11(f) third column).

At the same time, the complementary output f*, transiting to a LOW state, is fed back to change the capacitor 212 from a charging mode to a discharging mode. This is accomplished by the conduction of the shunting transistor 218. The LOW state in f* turns on the shunting transistor which provides a discharge path for the capacitor 212. During the discharge, the voltage across the capacitor decreases, resulting in $V_S$ increasing from $V_{ref}$ toward $V_{cc}$ (see FIG. 11(b) third column).

The capacitor switches back to the charging mode with the arrival of a HIGH state in f* at the gate of the shunting transistor 218. The edge of f* is caused by the complementary oscillator 220 having its $V_S$ reaches $V_{ref}$. In this way, while one of the oscillators is charging, the other one is discharging. Optimal timing can be controlled by adjusting the value of the capacitor 212 and the voltage $V_{ref}$ that must be developed before the switching of the charging and discharging modes.

Figure 10C:
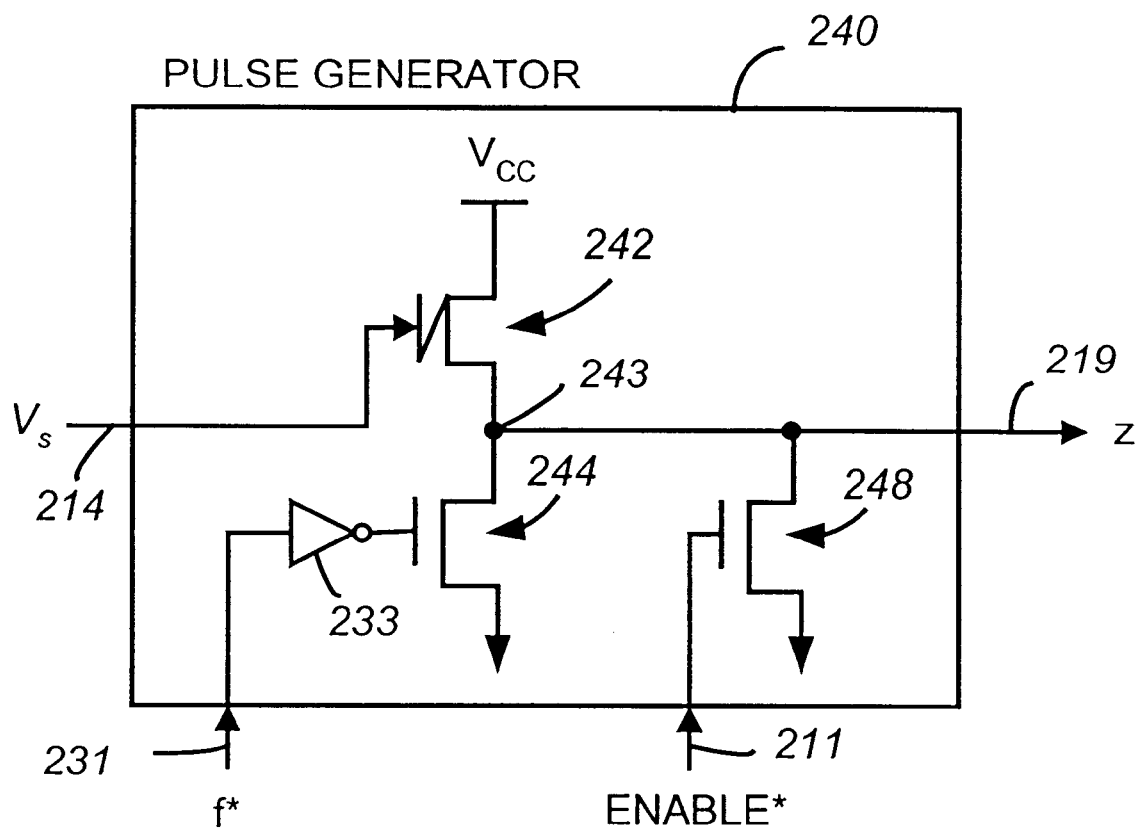
FIG. 10C illustrates a preferred embodiment of the pulse generator shown in FIG. 10B.
Figure 11:
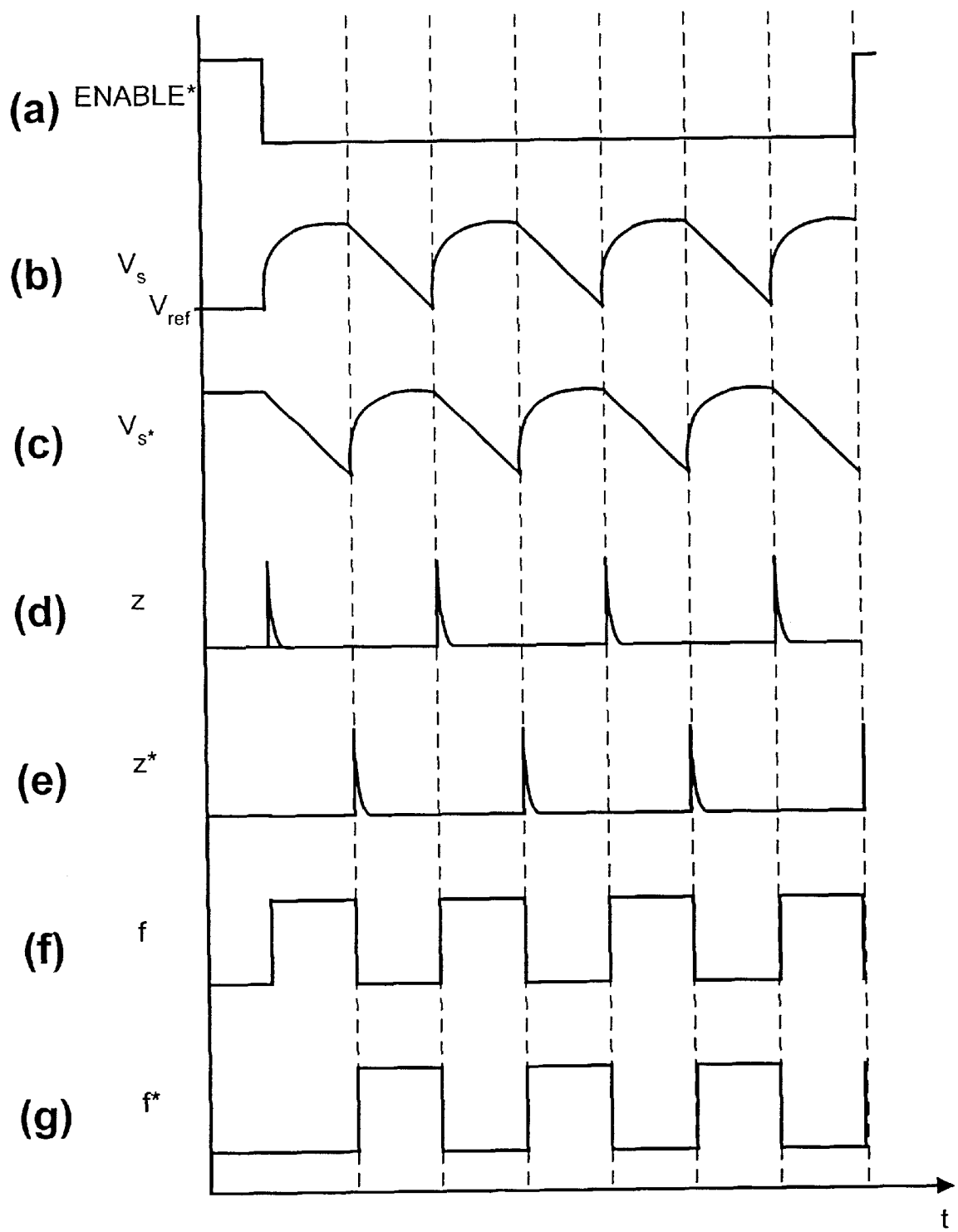
FIGS. 11(a)–11(g) are timing diagrams showing the outputs from the oscillators and the S-R latch of FIGS. 10A–10C.

FIG. 10C illustrates a preferred embodiment of the pulse generator shown in FIG. 10B. The pulse generator 240 is implemented by a pair of p-channel and n-channel transistors 242, 244 connected in series. Their common node 243 is output via the line 219 as the signal z. Essentially, the node 243 will be pulled up by the p-channel transistor 242 when the transistor's gate voltage drops to a reference voltage $V_{ref}$ equal or less than the threshold voltage $V_T$ of the transistor, i.e., $V_{ref}=V_T$, while the n-channel transistor 244 is turned off (see FIG. 11(d) between second and third column). This event takes place when $V_S^*$ from the capacitor 212, connecting to the gate of the transistor 242 drops to $V_{ref}(=V_T)$ (see FIG. 11(b) second column). The node 243 is pulled down by the n-channel transistor 244 to ground when it is turned on by a HIGH signal to its gate while the p-channel transistor 242 is turned off. The n-channel transistor is turned on (or off) by the input signal f* going LOW (or HIGH) which is inverted by an inverter 233 to a HIGH (or LOW) signal. Thus, as soon as the node 243 or the signal z is pulled high, it is pulled down again by f* going LOW (see FIG. 11(g) between second and third column). A second n-channel transistor 248 is used to disable the signal z in the output line 219 by shorting it to ground when the ENABLE* signal goes HIGH in the line 211 to its gate.

Figure 12:
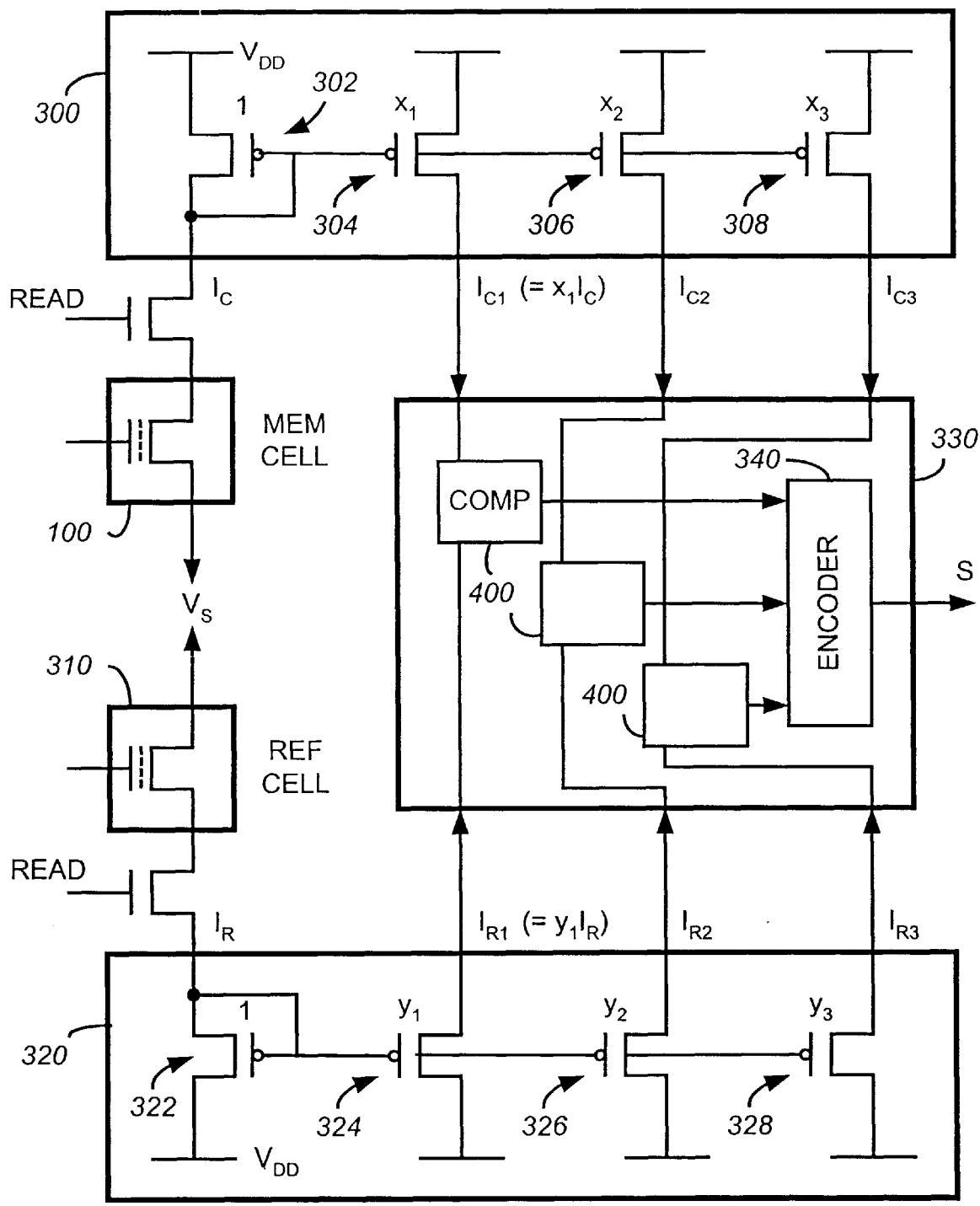
FIG. 12 is a detailed schematic block diagram of the sense amplifier shown in FIG. 4A, according to another preferred embodiment of the present invention.

FIG. 12 is a detailed schematic block diagram of the sense amplifier shown in FIG. 4A, according to another preferred embodiment of the present invention. In particular, the inventive features are incorporated into existing sense amplifiers for EEPROM or Flash EEPROM devices. A preferred multi-level sense amplifier is disclosed in U.S. Pat. No. 5,163,021, and relevant portions thereof are hereby incorporated by reference herein.

FIG. 12 shows a memory cell 100 whose source-drain current $I_C$ is being sensed by a sense amp relative to three reference currents. The example given is a multi-level cell capable of having its current programmed in one of four zones in the threshold window demarcated by the three reference currents. In this example, the memory cell 100 is therefore able to store two bits of data. The sense amplifier comprises a memory-cell current mirror 300, a reference cell 310, a reference-cell current mirror 320 and a comparator/encoder 330. The memory-cell current mirror 300 reproduces the current $I_C$ into three current branches, $I_{C1}$, $I_{C2}$, and $I_{C3}$. The reproduced currents are scaled from the original current $I_C$ by virtue of the relative size of the transistors associated with each branch. For example, if the transistor 302 associated with the original current branch $I_C$ is unity, and the transistors 304, 306, 308 associated with the three reproduced branches are respectively of size $x_1$, $x_2$ and $x_3$, then the reproduced current in each of the branches will be $I_{C1}=x_1 I_C$, $I_{C2}=x_2 I_C$ and $I_{C3}=x_3 I_C$, respectively. Similarly, the reference-cell current mirror 320 has transistors 322, 324, 326, and 328 with relative sizes of 1, $y_1$, $y_2$ and $y_3$. The corresponding three branches of reproduced reference currents are therefore given by $I_{R1}=y_1 I_R$, $R_{R2}=y_2 I_R$, $I_{R3}=y_3 I_R$, where the reference current $I_R$ is supplied by the reference cell 310. The comparator/encoder module 330 comprises for each current branch an integrating comparator 400 for comparing the branch cell current with the branch reference current. Each integrating comparator 400 essentially makes a time-averaged reading of the cell current and the reference current and compares the two. The outputs of all the integrating comparator 400 are encoded by an encoder 340 to be output as binary data S.

Figure 13A:
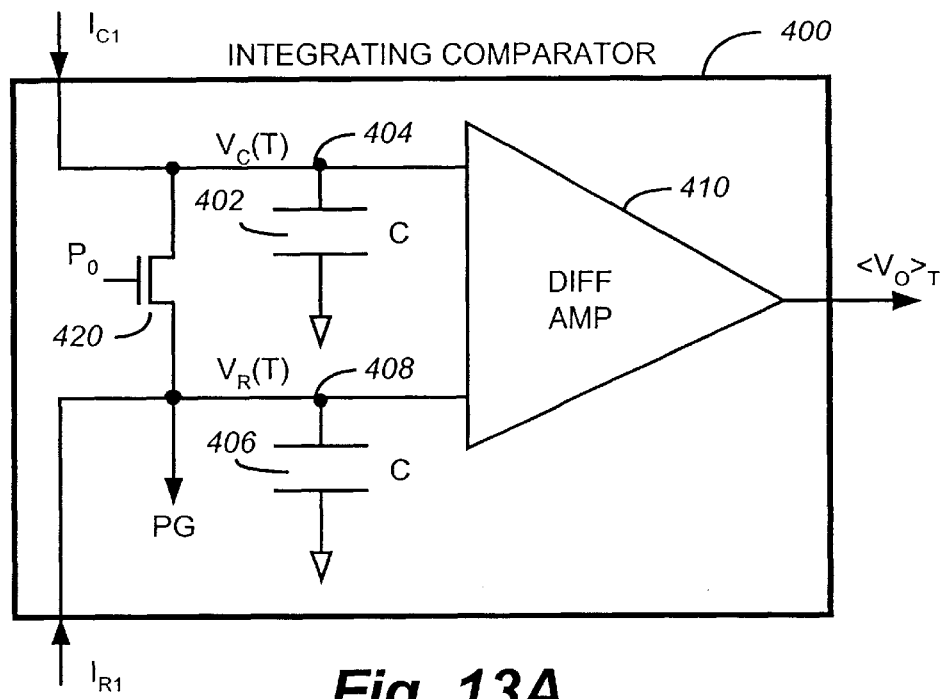
FIG. 13A illustrates a preferred embodiment of the integrating comparator shown in FIG. 12.

FIG. 13A illustrates one embodiment of the integrating comparator 400 shown in FIG. 12. Essentially the memory-cell branch current $I_{C1}$ charges up a capacitor 402 which develops a voltage $V_C(T)$ at a node 404 over a period T. Similarly, the reference-cell branch current $I_{R1}$ charges up a capacitor 406 which develops a voltage $V_R(T)$ at a node 408 over the same period T. These two voltages are compared by a differential amplifier 410 which outputs the comparison as $<V_0>_T$. Prior to the period T, the inputs to the differential amplifier, i.e., the node 404 the node 408 are set to the same voltage by means of a conducting transistor 420 which connects both nodes to a precharged line PG. Typically, the precharged line carriers a voltage of about half of $V_{CC}$. The transistor 420 is turned on at t<0 by a signal $P_0$. At $t \geq 0$, $P_0$ is de-asserted thereby turning off the equalizing transistor 420, and $I_{C1}$ and $I_{R1}$ are allowed to charge up the capacitors 402, 404 respectively. Thus, over the period from t=0 to t=T, the voltage $V_C(T)$ develops across the capacitor 402 while $V_R(T)$ develops across the capacitor 404. Depending on whether $V_C(T)$ is larger or less than $V_R(T)$, the output voltage at the differential amplifier 410, $<V_0>_T$, will show one or the other polarity. In this way, the memory-cell branch current $I_{R1}$ can be determined to lie to which side of the demarcating reference-cell branch current $I_{R1}$.

Figure 13B:
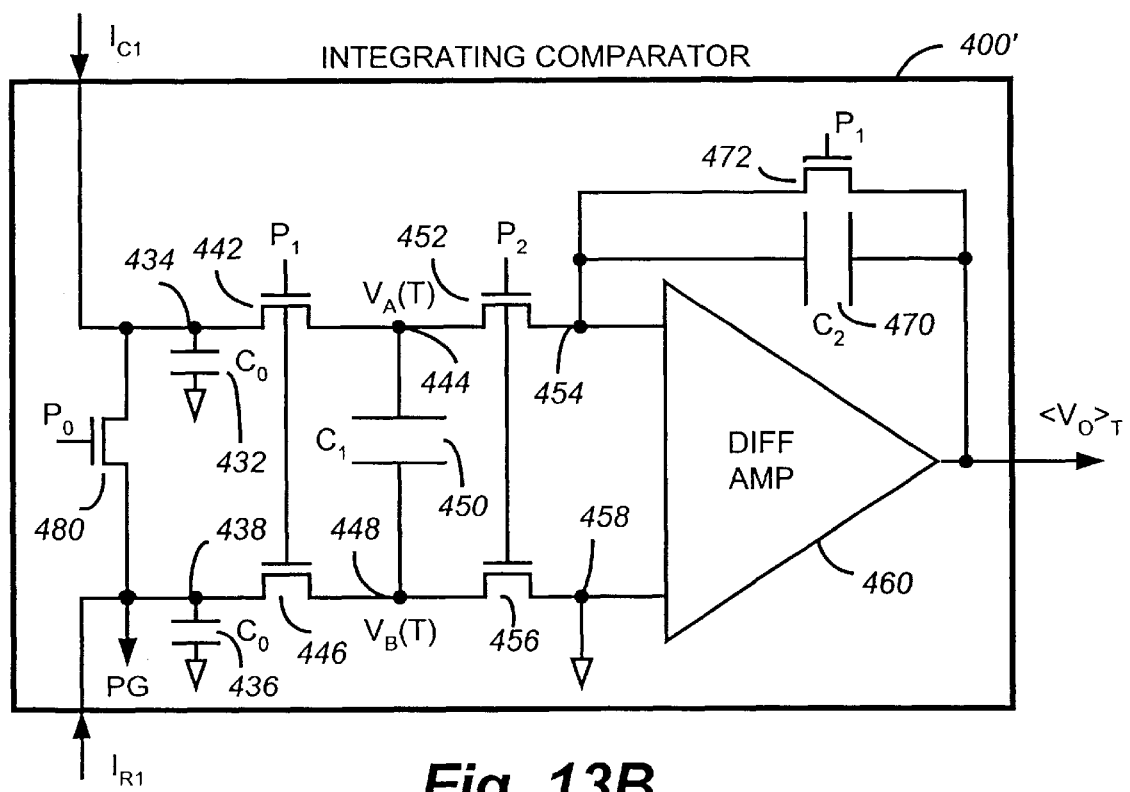
FIG. 13B illustrates another preferred embodiment of the integrating comparator shown in FIG. 12.

FIG. 13B illustrates another embodiment of the integrating comparator shown in FIG. 12 in the form of a switched capacitor differential amplifier 400'. Essentially, owing to the currents $I_{C1}$ and $I_{R1}$ gated by transistors 442, 446, a voltage $V_A(T)$ at a node 444 and a voltage $V_B(T)$ at a node 448 develop across a capacitor $C_1$ 450 after a period T. These voltages gated by transistors 452, 456 appear at inputs 454, 458 of a differential amplifier 460. The differential amplifier 460 operates in an op-amp configuration in which a second capacitor $C_2$ 470 is in its feedback loop. As a general property of the op-amp, the output $<V_0>_T$ of the op-amp will be such as to equalize the voltage on the two inputs 454, 458. With the input 458 grounded, effectively, the charge in $C_1$ is transferred to $C_2$, and $<V_0>_T = C_1/C_2[V_A(T)-V_B(T)]$. Similar to the circuit described in FIG. 13A, at time t<0, a pair of input nodes 434 and node 438 are set to the same voltage by means of a conducting transistor 480 which connects both nodes to a precharged line PG.

The timing of the various signals for one cycle are as follows. The transistor 480 is controlled by a signal $P_0$ which is asserted prior to t<0. Two initial capacitors $C_0$ 432, 436 at input nodes 434 and 438 help to allow a definite voltage to develop thereat. At t=0, $P_0$ is de-asserted, and a signal $P_1$ is used to turn on the pair of transistors 442, 446 for a period of time T. At the same time, $P_1$ is used to turn on a shunting transistor 472 that will discharge the capacitor $C_2$. At the end of the period T, the voltage $V_A(T)$ develops at the node 444 and the voltage $V_B(T)$ at the node 448 across the capacitor $C_1$. The signal $P_1$ is then de-asserted and a signal $P_2$ is used to turn on the transistors 452 and 454 so as to pass $V_A(T)$ and $V_B(T)$ to the inputs of the differential amplifier 460.

The embodiments shown in FIGS. 12 and 13 are based on adapting the invention to existing sense amplifier architectures. The resulting advantage is that little modifications need be made to existing highly optimized circuits. In addition, conventional and well known integrating amplifier techniques or switched capacitor differential amplifier can be employed. By the same token, these techniques are typically used in combination with other well established techniques such as filtering, analog-digital conversion, including offset cancellation and power supply or other noise rejections.

There are a number of configurations for current comparison in which multi-level sensing may be implemented with the sense amplifier shown in FIG. 12.

Figure 14A:
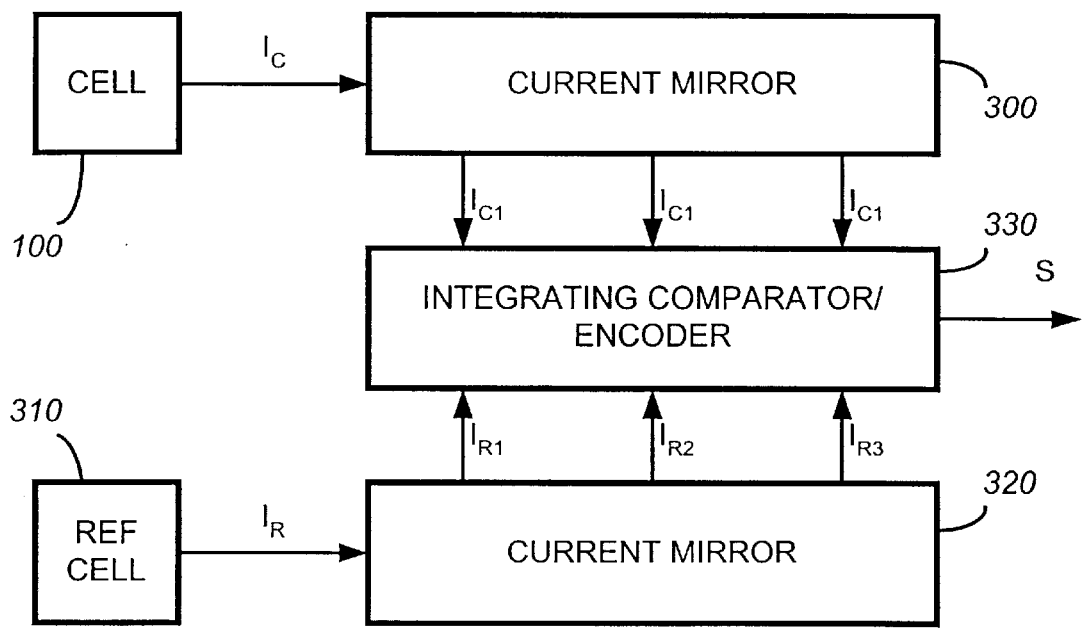
FIG. 14A illustrates one implementation of comparison between the memory cell's current and the reference currents.

FIG. 14A illustrates one implementation of comparison between a set of three substantially identical copies of currents scaled from that of the memory cell's current with a set of three different reference currents. Essentially, the sensing operation is to determine in which of the regions of the threshold window of the cell does the cell current lies. In the 4-level cell example, the regions are partitioned by three reference current levels. The current mirror implementation allows the cell current and the reference current to be respectively scaled by a factor proportional to the ratios of the transistors in each associated current mirror circuit. This enables the current comparison to be made in an optimal range of currents. The three reference currents $I_{R1}$, $I_{R2}$, $I_{R3}$ are reproduced by the current mirror 320 from a reference current $I_R$, which preferably is obtained from a reference memory cell. Similarly, the cell current $I_C$ is reproduced by the current mirror 300 into three copies, except each being the same $I_{C1}$. In this way each $I_{C1}$ may be used to compare against one of the reference current in parallel.

Figure 14B:
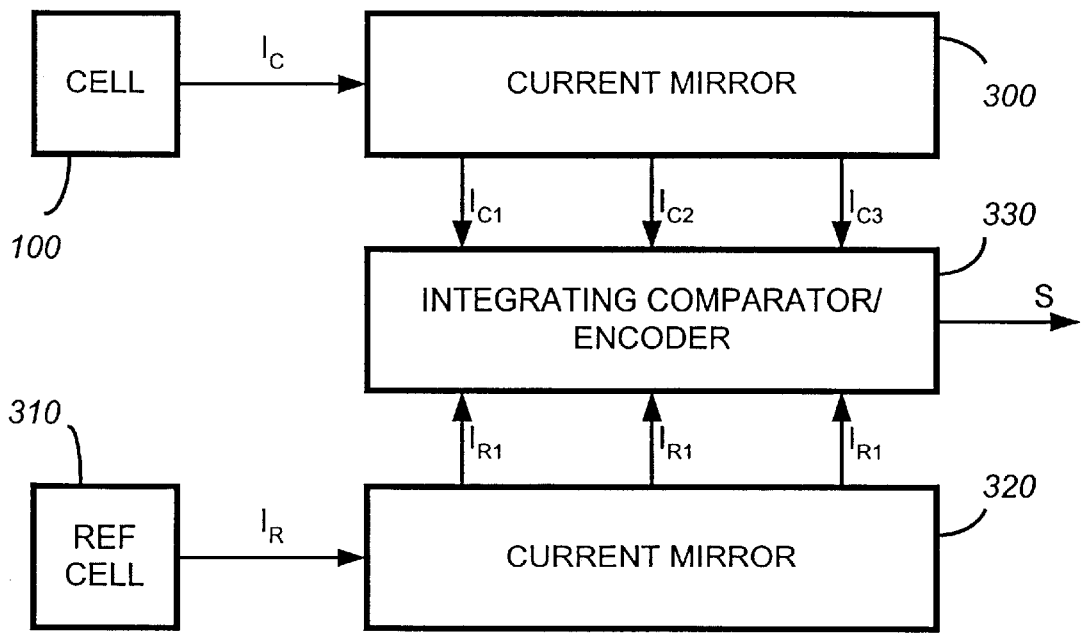
FIG. 14B illustrates a preferred implementation of comparison between the memory cell's current and the reference currents.

FIG. 14B illustrates a preferred implementation of comparison between the memory cell's current and the reference currents where all level comparison are made at the same optimal value. In other words, the current comparison for each level is to be made at the same predetermined level optimal for sensing, say $I_{R1}$, which is independent of the data stored in the memory cell to be sensed. The current mirror 320 is constructed to produce the three reference currents to be the same $I_{R1}$. On the other hand, the current mirror 300 is constructed with the cell current $I_C$ reproduced into $I_{C1}$, $I_{C2}$, $I_{C3}$ in ratios to the relative positions of the three breakpoint levels in the threshold window of the cell. In this way each $I_{C1}$ may be used to compare against an optimal, fixed reference current in parallel. This is advantageous in that all integrating comparators can be made identical.

While the embodiments of this invention that have been described are the preferred implementations, those skilled in the art will understand that variations thereof may also be possible. For example, other types of integrating sense amplifiers that effectively average out the random noise fluctuations are also applicable. Although the example of a three-level partitioned cell is described, other single-level or multi-level cells are equally applicable. Therefore, the invention is entitled to protection within the full scope of the appended claims.

What is claimed is:

1. In a non-volatile memory comprising an array of memory cells, each memory cell having a source, a drain, a charge storage and a control gate, said charge storage receptive to variable amount of charges being stored therein for designating one of a plurality of memory states, a method of sensing one of said plurality of memory states of a memory cell, comprising:

applying predetermined voltages respectively to the source, the drain and the control gate of said memory cell being sensed, thereby producing a source-drain current relative to the amount of charges stored in the charge storage of said memory cell being sensed, said source-drain current having an inherent noise fluctuation component; and obtaining an average value of said source-drain current over a predetermined period of sensing time sufficient for the noise fluctuation component therein to cancel to a predetermined level;

determining whether said average value of said source drain current is higher or lower than a predetermined value.

2. A method of sensing one of said plurality of memory states of a memory cell as in claim 1, further comprising:

charging a capacitor with said source drain current over said predetermined period of sensing time;

determining a rate of said charging; and obtaining said average value of said source drain current as a function of said rate of said charging.

3. A method of sensing one of said plurality of memory states of a memory cell as in claim 1, wherein obtaining said average value of said source drain current further comprises:

generating a waveform having a frequency depending on said source drain current averaged over said predetermined period of sensing time; and obtaining said average value of said source drain current as a function of the frequency of said waveform.

4. A method of sensing one of said plurality of memory states of a memory cell as in claim 3 wherein said waveform has a wave train with a number of periods in said predetermined period of sensing time; and said average value of said source drain current is obtained as a function of said number of periods.

5. A non-volatile memory comprising an array of memory cells, each memory cell having a source, a drain, a charge storage and a control gate, said charge storage receptive to variable amount of charges being stored therein for designating one of a plurality of memory states, said non-volatile memory further comprising:

means for applying predetermined voltages respectively to the source, the drain and the control gate of said memory cell being sensed, thereby producing a source-drain current relative to the amount of charges stored in the charge storage of said memory cell being sensed, said source-drain current having an inherent noise fluctuation component; and means for obtaining an average value of said source-drain current over a predetermined period of sensing time sufficient for the noise fluctuation component therein to cancel to a predetermined level;

means for determining whether said average value of said source drain current is higher or lower than a predetermined value.

6. A non-volatile memory as in claim 5, further comprising:

means for charging a capacitor with said source drain current over said predetermined period of sensing time;

means for determining a rate of said charging; and means for obtaining said average value of said source drain current as a function of said rate of said charging.

7. A non-volatile memory as in claim 5, further comprising:

means for generating a waveform having a frequency depending on said source drain current averaged over said predetermined period of sensing time; and means for obtaining said average value of said source drain current as a function of the frequency of said waveform.

8. A non-volatile memory as in claim 7, wherein said waveform has a wave train with a number of periods in said predetermined period of sensing time; and said average value of said source drain current is obtained as a function of said number of periods.

9. A non-volatile memory comprising an array of memory cells, each memory cell having a source, a drain, a charge storage and a control gate, said charge storage receptive to variable amount of charges being stored therein for designating one of a plurality of memory states, said non-volatile memory further comprising:

predetermined voltages being applied respectively to the source, the drain and the control gate of a memory cell being sensed, thereby producing a source-drain current relative to the amount of charges stored in the charge storage of said memory cell being sensed, said source-drain current having an inherent noise fluctuation component; and a sensing circuit connectable to said memory cell to sense the memory state thereof as a function of an average value of said source-drain current over a predetermined period of sensing time sufficient for the noise fluctuation component therein to cancel to a predetermined level.

10. A non-volatile memory as in claim 9, wherein said sensing circuit further comprises:

a comparator to determine whether said average value of said source drain current is higher or lower than a predetermined value.

11. A non-volatile memory as in claim 9, wherein said sensing circuit further comprises:

a first capacitor coupled to be charged by said source drain current, said first capacitor having a charging rate dependent on said average value of said source drain current over said predetermined period of sensing time.

12. A non-volatile memory as in claim 9, wherein said sensing circuit further comprises:

a comparator to determine whether said average value of said source drain current is higher or lower than a predetermined value.

13. A non-volatile memory as in claim 9, wherein:

said comparator further comprises a second capacitor coupled to be charged by a predetermined reference current, said second capacitor having a charging rate dependent on said predetermined reference current over said predetermined period of sensing time; and said comparator determines whether said average value of said source drain current is higher or lower than said predetermined reference current as determined by functions of their respective charging rates.

14. A non-volatile memory as in anyone of claims 5–13, wherein said charge storage includes a floating gate.

15. A non-volatile memory as in anyone of claims 5–13, wherein a plurality of memory cells is sensed in parallel.

16. A non-volatile memory as in anyone of claims 5–13, wherein said array of memory cells is EEPROM.

17. A non-volatile memory as in anyone of claims 5–13, wherein said array of memory cells is Flash EEPROM.

18. A non-volatile memory as in anyone of claims 5–13, wherein said plurality of designated states is two.

19. A non-volatile memory as in anyone of claims 5–13, wherein said plurality of designated states is greater than two.

* * * * *